United States Patent
Finneman et al.

(10) Patent No.: US 7,283,370 B2
(45) Date of Patent: Oct. 16, 2007

(54) ANTI-STRIP SCREW BOSS

(75) Inventors: Darrell R. Finneman, Albany, OR (US); Gregory A. Mouchka, Portland, OR (US); Michael P. O'Dierno, Beaverton, OR (US)

(73) Assignee: Xerox Corporation, Stamford, CT (US)

( * ) Notice: Subject to any disclaimer, the term of this patent is extended or adjusted under 35 U.S.C. 154(b) by 343 days.

(21) Appl. No.: 10/749,786

(22) Filed: Dec. 30, 2003

(65) Prior Publication Data

US 2005/0146857 A1 Jul. 7, 2005

(51) Int. Cl.
*H05K 1/14* (2006.01)

(52) U.S. Cl. .................. 361/740; 361/810; 361/807; 174/138 G (58) Field of Classification Search .......... 361/807, 361/810, 758, 742, 804, 803; 174/138
See application file for complete search history.

(56) References Cited

U.S. PATENT DOCUMENTS

| | | | |
|---|---|---|---|
| 4,104,446 A | | 8/1978 | Johnson |
| 4,334,815 A | * | 6/1982 | Knohl ..................... 411/368 |
| 4,371,286 A | | 2/1983 | Okamura et al. |
| 4,535,656 A | * | 8/1985 | Orban ....................... 81/57.38 |
| 4,576,534 A | * | 3/1986 | Barth et al. ................ 411/412 |
| 4,580,689 A | * | 4/1986 | Slater ........................ 220/3.2 |
| 4,639,996 A | | 2/1987 | Fullmer |
| 4,749,319 A | | 6/1988 | Sygnator |
| 5,385,439 A | | 1/1995 | Hurdle |
| 5,419,665 A | * | 5/1995 | Adams et al. ................ 411/84 |
| 5,704,750 A | * | 1/1998 | Bartos et al. ............... 411/411 |
| 5,980,177 A | * | 11/1999 | Schiess et al. .............. 411/299 |
| 6,077,015 A | | 6/2000 | Leibman |
| 6,225,566 B1 | * | 5/2001 | Dienst ..................... 174/138 E |
| 6,302,723 B1 | | 10/2001 | Baum et al. |
| 6,565,302 B2 | | 5/2003 | Werner et al. |
| 6,580,886 B1 | | 6/2003 | Howard et al. |

* cited by examiner

*Primary Examiner*—Dean A. Reichard
*Assistant Examiner*—Hung S Bui
(74) *Attorney, Agent, or Firm*—Fay Sharpe LLP (57) ABSTRACT

A support member includes a support panel and a retention element for use in mounting an associated component to the support panel. The retention element defines a bore for receiving an associated threaded fixing element which mounts the component to the support panel. A protrusion extends into the bore from a sidewall thereof. The protrusion assists in positioning the fixing member on reinsertion of the fixing member into the bore, such that the frequency of stripping of a thread of the bore is reduced.

22 Claims, 13 Drawing Sheets

ANTI-STRIP SCREW BOSS

BACKGROUND

The present exemplary embodiment relates to a boss which resists stripping of internal threads with repeated threading of a screw. It finds particular application in conjunction with the attachment of components to a printer chassis, and will be described with particular reference thereto. However, it is to be appreciated that the present exemplary embodiment is also amenable to other like applications.

Office machines, such as printers, copiers, and fax machines generally include a chassis formed of metal, on which a variety of components, such as fans, motors, drive systems, and the like, are separately mounted. The chassis is provided with bosses, which project from a generally planar frame for receiving screws by which the various components are attached. Injection molded plastic provides a cost effective alternative for forming components which have traditionally been formed of metal.

The screws used to attach the components to the chassis may be self-tapping or form threading screws which create a thread in the boss during the first insertion. When the component is replaced or repaired, the screws are removed and replaced along with the new or repaired component. Sometimes, the replaced screw does not engage the original thread in the boss and a second thread is formed. This reduces the amount of material available in the boss for creating new threads. The screw reaches higher torques as it is beginning to clamp. The reduced amount of material may be unable to handle the loads and it is stripped off, creating a stripped screw boss without threads.

Where multiple bosses are used and the screws are inserted and removed multiple times, the chances of a single boss failure preventing reassembly of the component are multiplied. For example, there may be twenty bosses on a chassis. For bosses having a failure rate of only 0.2%, and if five of the screws are replaced with two insertions each, the chance of one of the components being inadequately mounted is 1%. Since the screws may be rethreaded one or more times even before the printer leaves the factory, the possibility of a component mounting failure during a first or second service operation can be significant. While hand threading of screws can reduce the incidence of boss thread stripping, it is generally not a cost effective option in most manufacturing and service environments.

Various methods have been developed for reusing a boss which has had its thread stripped. In one method, the original screw is replaced with a screw with a larger thread diameter, which creates a new thread in the boss. In another method, part of the boss is cut out and replaced with an insert part. The insert part may be molded in or sonically welded to the chassis. In the field, however, the technician may not always have extra-enlarged screws available. Creating an insert is a time consuming process and is not always effective in terms of boss reliability. Thus, there are instances where an entire printer is replaced due to failure of a single boss.

The present exemplary embodiment contemplates a new and improved boss and method of use, which overcomes the above-referenced problems and others.

BRIEF DESCRIPTION

In accordance with one aspect of the present exemplary embodiment, a support member includes a support panel and a retention element carried by the support panel for use in mounting an associated component to the support panel. The retention element defines a bore for receiving an associated threaded fixing element which mounts the component to the support panel. A protrusion extends into the bore from a sidewall thereof.

The advantages and benefits of the present exemplary embodiment will become apparent to those of ordinary skill in the art upon reading and understanding the following detailed description of the preferred embodiments.

BRIEF DESCRIPTION OF THE DRAWINGS

The exemplary embodiment may take form in various components and arrangements of components, and in various steps and arrangements of steps. The drawings are only for purposes of illustrating preferred embodiments and are not to be construed as limiting the exemplary embodiment.

DETAILED DESCRIPTION

While the present invention will hereinafter be described in connection with its preferred embodiments and methods of use, it will be understood that it is not intended to limit the invention to these embodiments and method of use. On the contrary, the following description is intended to cover all alternatives, modifications, and equivalents, as may be included within the spirit and scope of the invention as defined by the appended claims.

Figure 1:
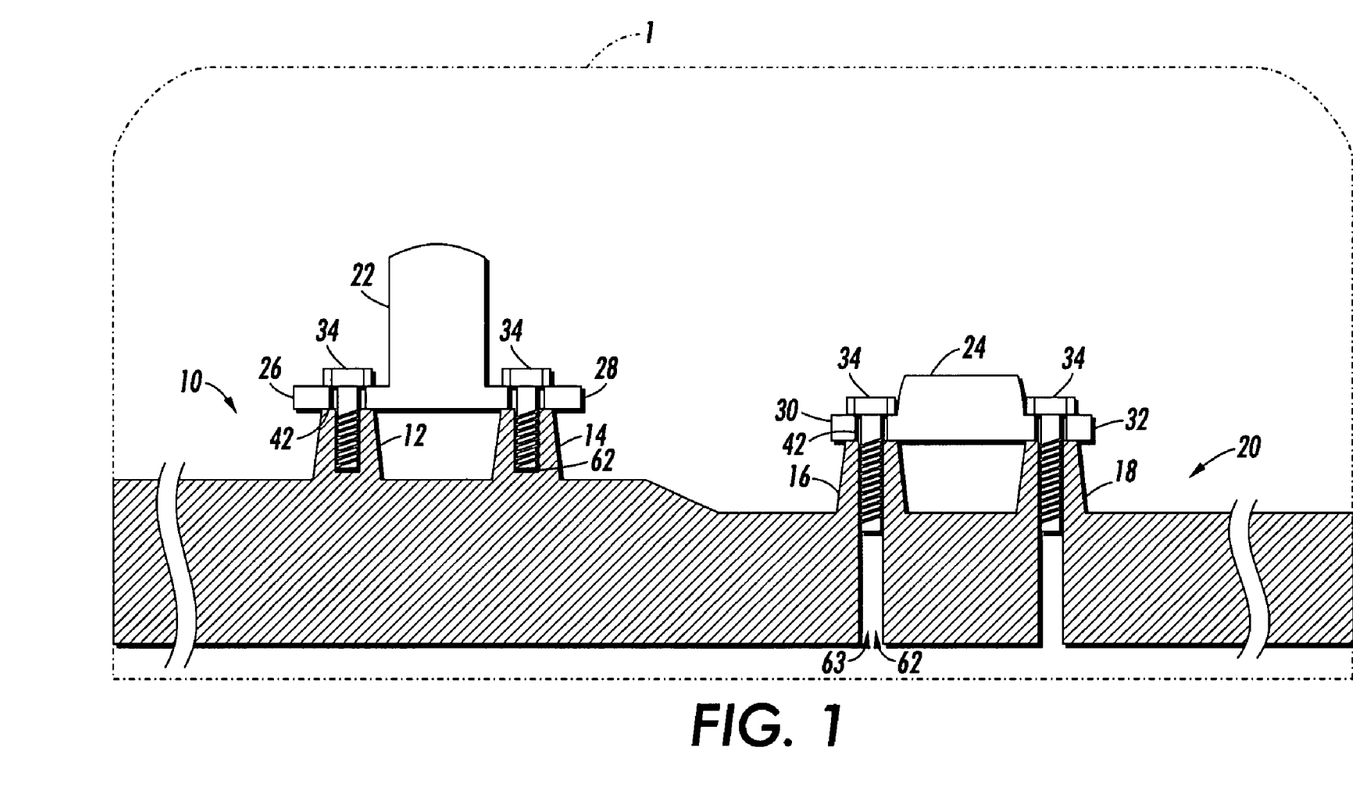
FIG. 1 is a schematic side view of a chassis provided with bosses according to an exemplary embodiment.

With reference to FIG. 1, an exemplary imaging device 1, such as a printer (illustrated in phantom), includes a support member 10, such as a chassis. The chassis 10 includes a plurality of retention elements, such as bosses 12, 14, 16, 18, which extend from an otherwise generally planar support panel 20. The support panel 20 and bosses 12, 14, 16, 18 may be integrally formed, for example in an injection molding process, although it is also contemplated that the bosses may be otherwise rigidly attached to the chassis 10. Suitable materials for forming the chassis include relatively rigid materials, such as plastics and metals. An exemplary material is a hard plastic, such as a blend of polystyrene and polyphenylene oxide (PPO), reinforced with glass, mineral, or carbon fiber, which is commercially available as Noryl™ from the General Electric Company.

The bosses 12, 14, 16, and 18 are spatially arranged on the support panel 20 for accurate alignment and securement of components or modules 22, 24, such as fans, motors, print heads, and the like to the chassis 10. Each component 22, 24 may be associated with several of the bosses and include corresponding lug members 26, 28, 30, 32, which are positioned over corresponding ones of the associated bosses. During assembly of the imaging device, threaded fixing members 34, such as screws, are each inserted through a corresponding hole 42 in the respective lug members 26, 28, 30, 32, to secure the component to the support panel. In particular, thread cutting or thread forming screws 34, which create a thread in the corresponding boss 12, 14, 16, 18 during the first insertion, are suitable for this purpose. Screws 34 can all be similarly formed and thus reference is made to a single screw 34, with the understanding that the description applies equally to other screws.

Figure 2:
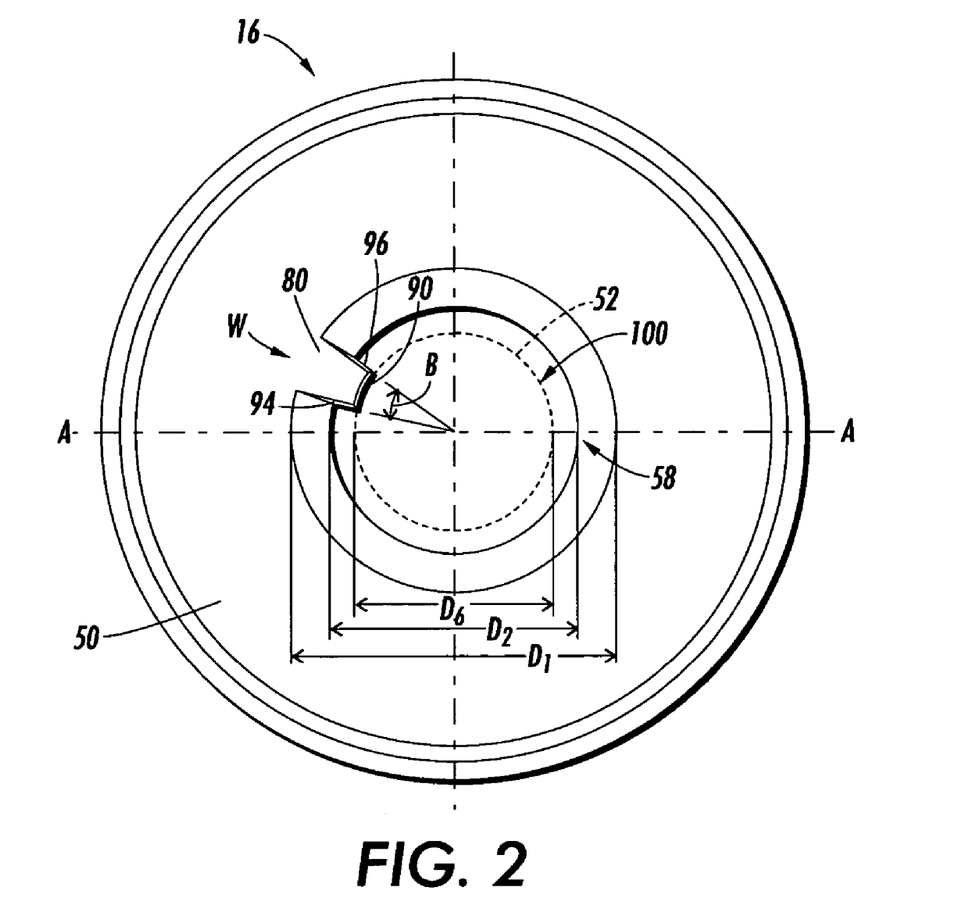
FIG. 2 is an enlarged top plan view of a boss according to a first embodiment.
Figure 3:
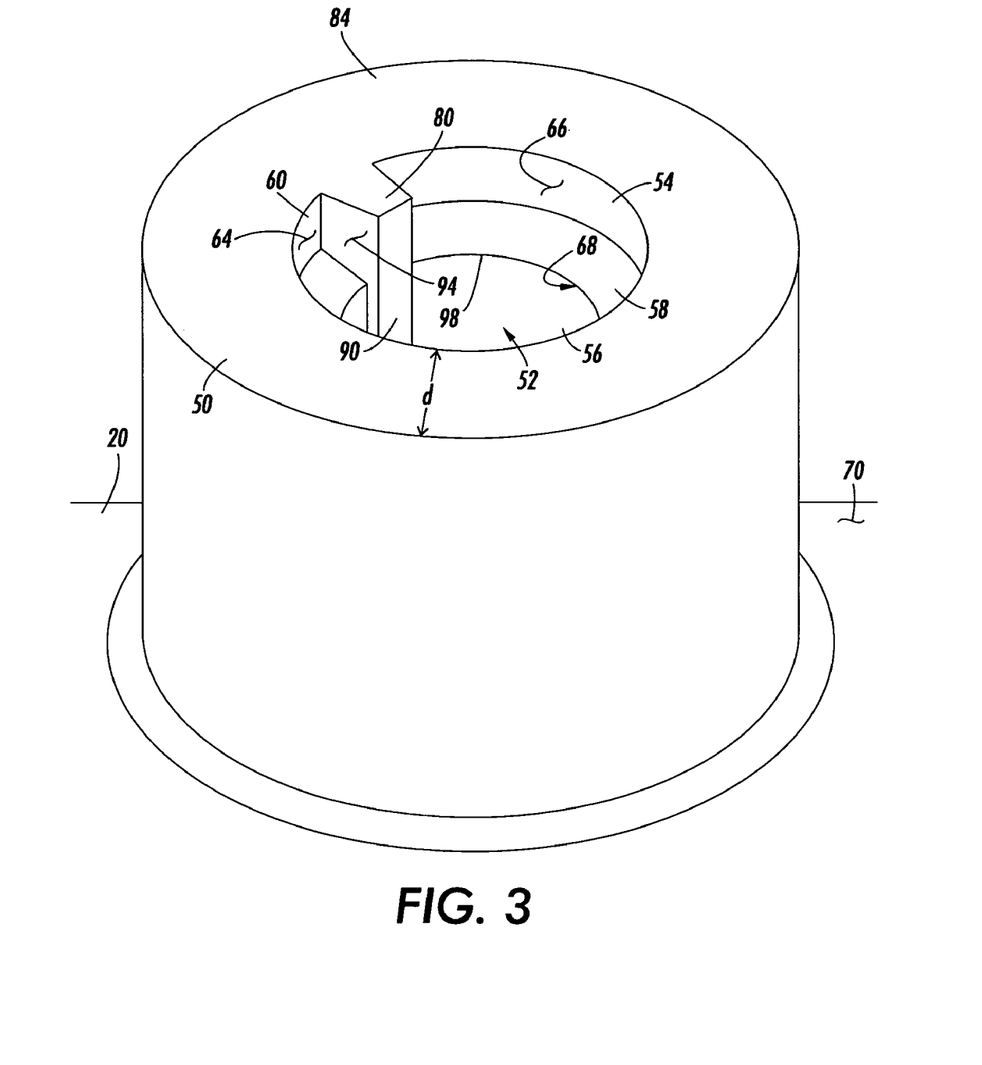
FIG. 3 is an enlarged perspective view of the boss of FIG. 2.

With reference also to FIGS. 2-7, each boss includes a generally cylindrical side wall 50 which defines an axial interior bore 52 having a central rotational axis X. The interior bore 52 may be a through bore, as illustrated for bosses 16 and 18 of FIG. 1, or be a blind (closed off) bore, as for the bosses 12 and 14. For ease of reference, boss 16 will be described in detail, although it will be appreciated that other bosses can be similarly formed. The bore 52 includes upper and lower bore portions 54, 56, spaced by a chamfer or shelf 58, which may be angled as illustrated in FIG. 3. It will be appreciated that the terms "upper" and "lower" and the like refer to the orientation of the bosses as illustrated in FIGS. 1 and 2 and that, in practice, the bosses may have other orientations.

Figure 4:
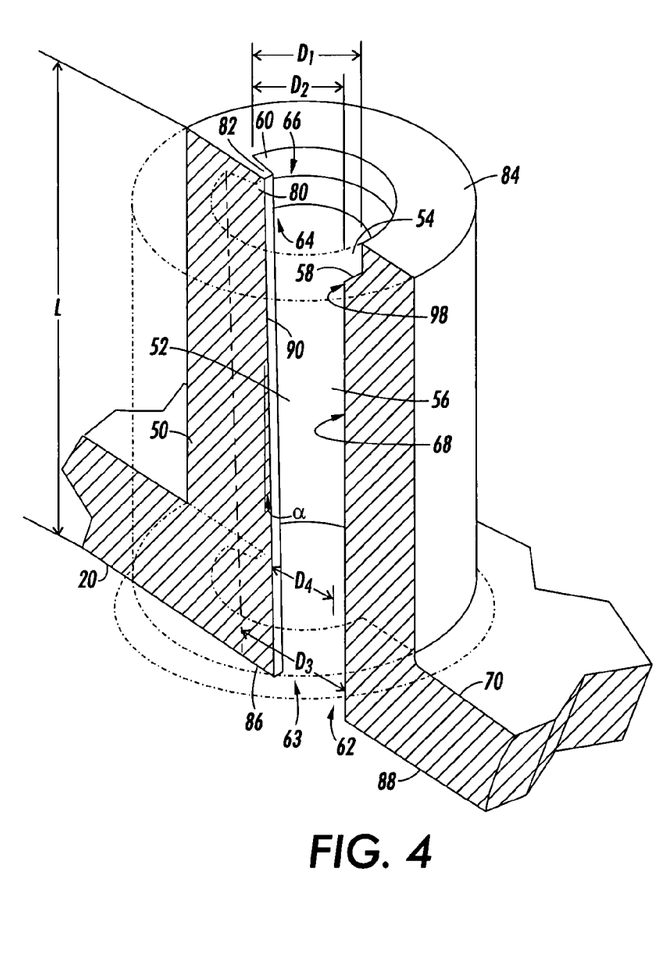
FIG. 4 is a side view, in partial section, of the boss of FIG. 2.

With particular reference to FIG. 4, the upper bore portion or counter bore 54 extends from an upper opening 60 of the bore to the chamfer 58. The lower bore portion 56 extends from the chamfer 58 to a lower end 62 of the bore, which in the illustrated embodiment, defines an opening 63. An interior wall surface 64 of the side wall 50 includes a generally cylindrical upper portion 66, which defines the upper bore portion 54, and a generally cylindrical lower portion 68, which defines the lower bore portion 56. The upper bore portion 54 has an interior diameter $D_1$, adjacent the chamfer 58, which is larger than a maximum interior diameter $D_2$ of the lower portion 56 of the bore 52. In one embodiment, shown in FIG. 4, the lower portion 68 of the wall surface tapers at an angle α, such that the lower bore portion 56 decreases in diameter towards the lower end 62 of the bore. A minimum interior diameter $D_3$ of the bore is located at or adjacent the lower end 62. The taper α may be relatively shallow, such as about 0.2-1.0°, in one embodiment, about 0.5°, thus, the difference between $D_2$ and $D_3$ is relatively small.

It will be appreciated that while the counterbore 54 and shelf 58 are useful in positioning of the screw 34, the counterbore and shelf can alternatively be eliminated. It will also be appreciated that the bore 52 may alternatively be formed in a part of the support panel 20 which does not extend in the form of a boss, i.e., an upper end of the bore may be level with or only slightly above an upper surface 70 of the support panel. Additionally, other fixing members may be used in place of screws, such as bolts, or the like. For ease of reference, however, the description will refer to the bore as being formed in a boss and the fixing member as being a screw.

A protrusion 80, such as a rib, projects radially inwardly from the side wall 50 into the bore 52, thereby decreasing the internal diameter of the bore in the region of the rib. The rib 80 provides an anti-thread stripping function, which will be described in greater detail below. In one embodiment, illustrated in FIG. 4, the rib extends generally parallel with the axis X, along the entire bore 52, thus projecting into the bore in both upper and lower bore portions 54, 56. In this embodiment, a top surface 82 of the rib 80 is coplanar with a top surface 84 of the sidewall 50. Similarly, a bottom surface 86 of the rib is coplanar with a lower surface 88 of the support panel. The length I of the rib is thus coextensive with the length of the bore. However, it is also contemplated that the rib 80 may extend only in the lower portion 56 or upper portion 54 of the bore, or in a selected portion or portions thereof. In an alternative embodiment shown in FIG. 8, for example, a rib extends only in the lower portion.

Figure 6:
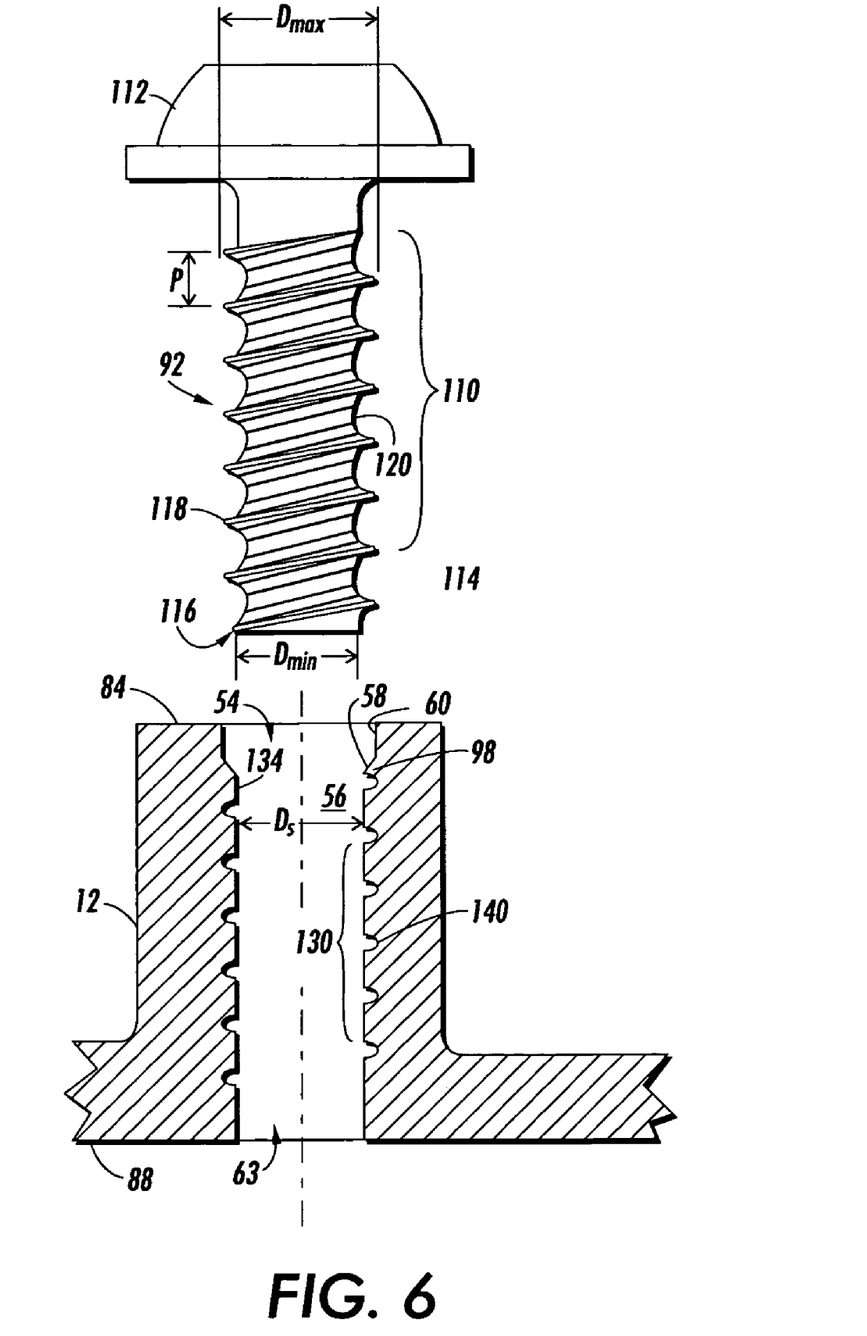
FIG. 6 is a cross sectional view of the boss of FIG. 5 through A-A of FIG. 2.
Figure 7:
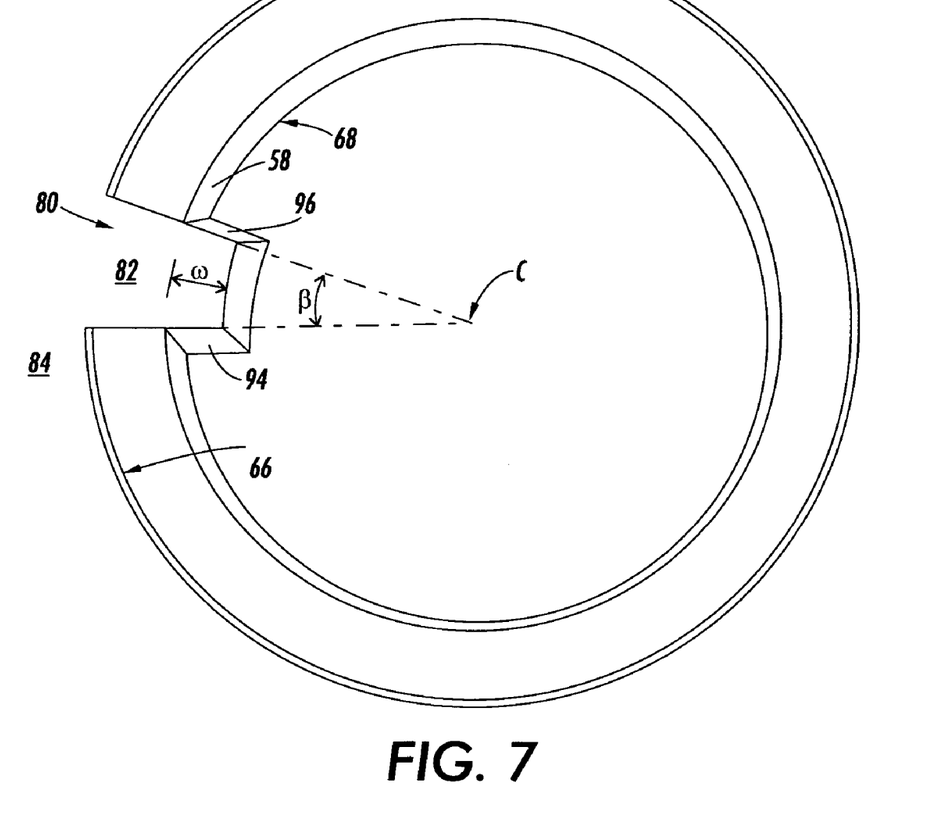
FIG. 7 is a perspective view of a lower open end of the boss of FIG. 2.

As shown in FIG. 2, the rib 80 includes an outer surface 90 which faces into the bore for engaging a threaded portion 92 of the screw 34 (FIG. 6). The rib 80 thus acts as a key, urging the threaded portion 92 of the screw into a correct position for threading, as described in greater detail below. Side surfaces 94, 96 of the rib 80 connect the outer surface 90 to the interior wall surface 64 of the bore. The side surfaces 94, 96 may taper as shown in FIG. 7, for ease of manufacture. The outer surface 90 is spaced radially inwardly from an upper end 98 of the lower portion 68 of the wall surface by a width W and from the upper wall portion by a width equal to $W+(D_1-D_2)$. In the embodiment illustrated in FIG. 2, the outer surface 90 defines an arc of an imaginary circle 100 having its center at the X-axis. The width W of the rib 80 is thus uniform in its cross section, in this embodiment. In one embodiment, the imaginary circle has a diameter $D_4$ of about 75-90% of the maximum diameter $D_2$ of the lower bore portion (i.e., adjacent the shelf 58). In one specific embodiment, the diameter $D_4$ of the imaginary circle is about 80% of the diameter $D_4$.

The actual diameters $D_2$, $D_4$ and taper of the bore 52 will depend, to some degree, on the type and diameter of the screw 34 to be used with the boss 12, 14, 16, 18. Manufacturer's guidelines for shaping the boss may be followed in forming the bore, with the exception of the rib.

It will be appreciated that the outer surface 90 of the rib 80 may have other configurations than the concave shape illustrated. For example, the outer surface may have a convex, parabolic, elliptical, or linear shape, for which purposes W is considered to be the maximum width of the rib. In one embodiment of a rib 102, illustrated in FIG. 9, where similar elements are given the same numerals, and new elements new numerals, an outer surface 104 of the rib 102 tends toward the interior wall surface 64. The rib has a helical shape, similar to the thread of the screw. The maximum width W of the rib 102 is located adjacent to a single side surface 108 of the rib. In this embodiment, the width of the rib 102 diminishes across the cross section.

With reference once more to FIG. 4, the width W of the rib 80, 102 may be consistent along the axial length of the lower portion 56 of the bore 52. Thus, where the bore 52 is tapered, a diameter of the circle 100 inscribed by the rib decreases towards the lower end of the bore to a minimum value of $D_5$. Alternatively, the width W of the rib varies along the axial length of the bore 52. For example, the width W may decrease, consistent with the taper, such that the circle 100 inscribed by the rib remains of a constant diameter.

With reference to FIG. 7, rib 80 subtends an angle β from a center C of the imaginary circle 100, which is coaxial with a circle defined by the bore 52. In one embodiment, β is from about 10° to about 30° at the top 82 of the rib. In one specific embodiment, β is about 20°. The front surface 90 and side surfaces 94, 96 of the rib 80 may taper outward, toward the lower end 62 of the bore, as discussed above. For example, the taper of the sides and front surface may be about 0.2 to about 1°. In one specific embodiment, the taper is about 0.5°. Thus, the rib may increase in the angle β subtended by the rib toward the lower end 62 of the bore. It will be appreciated that where the taper β on the outer surface 90 of the rib is the same as the taper a on the bore, the width W of the rib remains constant.

While the bore 52 has been described as having a single rib 80, 102, it is also contemplated that the bore may be provided with two or more arcuately spaced ribs. However, the ribs in this embodiment are generally located within an arc of the imaginary circle 100 which subtends an angle of less than 180 degrees, in one embodiment, less than 120°.

With reference once more to FIG. 6, the threaded portion 92 of the screw 34 includes an upper threaded portion 110, which extends from a head 112 of the screw, and a lower threaded portion 114, adjacent a tip 116 of the screw. The threaded portion 92 has a maximum diameter $D_{MAX}$ in the upper threaded portion 118. The maximum diameter $D_{MAX}$ includes both the width of a helical thread 118 and the width of an axial shaft 120 of the screw. The thread 118 and/or shaft may diminish in width toward the tip 116, i.e., in the lower threaded portion 114. In one embodiment, the lower threaded portion 114 occupies one to two turns of the thread. The minimum diameter $D_{MIN}$ of the screw is the diameter of the shaft 120, which generally remains consistent along the length of the screw 34. However, shafts of other configurations are also contemplated, such as those which present one or more blunted faces adjacent the tip of the screw. Additionally, while the screw 34 is described as having a single helical thread 118, it is also contemplated that a screw may have two or more threads.

In one embodiment, the rib 80, 102 has a length l which is at least twice a pitch p of the screw 34. In another embodiment, the rib has a length which is greater than that of the lower threaded portion 114 of the screw.

Figure 5:
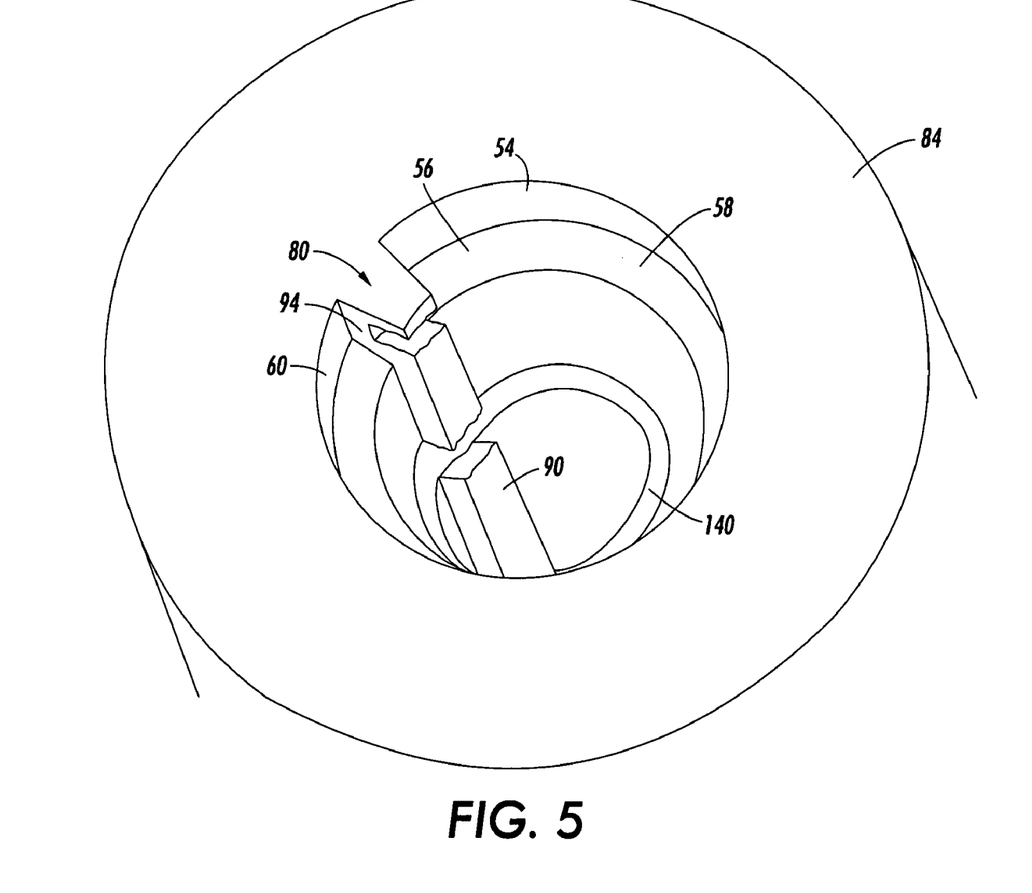
FIG. 5 is a perspective view of an upper end of the boss of FIG. 2 after formation of a helical thread.

For forming a helical thread in the bore lower portion, the maximum screw diameter $D_{MAX}$ is somewhat greater than the diameter $D_5$ of the lower bore portion in a thread-forming region 130 of the bore. Depending on the maximum diameter $D_{MAX}$ of the screw employed, and the degree of taper a on the bore, the thread-forming region 130 of the bore may be adjacent the shelf 58, as illustrated in FIG. 6, or it may be slightly spaced from the shelf, between the shelf and the lower end 62 of the bore. The diameter $D_5$ of the lower bore portion 56, within the thread forming region 130 is greater than the minimum diameter $D_{MIN}$ of the screw, in the illustrated embodiment. This minimizes stripping of the thread forming region 130 of the bore by the shaft. In one embodiment, the diameter $D_6$ of the imaginary circle inscribed by the rib 80 at an upper end 134 of the thread forming region 130 (i.e., where the screw begins to bite during its first insertion) is less than the maximum diameter $D_{MAX}$ of the screw 34. In one specific embodiment, the diameter $D_6$ of the imaginary circle at the upper end of the thread forming region is about the same as the minimum diameter $D_{MIN}$ of the screw. The rib 80 can inscribe a larger or smaller diameter of circle than the minimum diameter $D_{MIN}$, however. Where the diameter $D_6$ is smaller than $D_{MIN}$, a portion of the rib 80 tends to be ground away during the initial threading of the screw 34, as illustrated in FIG. 5. In general, it has been found that smaller ribs (i.e., those which inscribe a circle 100 of diameter $D_6$ about equal to the minimum diameter $D_{MIN}$ of the screw 34, or slightly greater than the minimum diameter) perform more effectively than larger ribs.

Prior to first use of the boss 16, the bore 52 is relatively smooth, as illustrated in FIG. 3. The screw 34 is threaded into the bore 52 by rotating the screw in a threading direction while applying an axial pressure, for example, with a manual screwdriver or an automatic driver. The thread 118 of the screw forms a helical thread or groove 140 in the interior wall, which extends toward the lower end 62 of the bore (FIG. 5). Portions of the rib 80 tend to be ground away during the initial threading, although sufficient portions of the rib remain intact to act as a screw positioning device in a subsequent screw threading operation.

In the event that a screw 34 is to be removed from its boss 12, 14, 16, 18, for example, for repair or replacement of the component 22, 24, the screw is unthreaded from the bore by rotation of the screw in an opposite direction to the threading direction, leaving the helical groove 140 substantially intact. Once the repaired or replacement component is positioned over the respective bosses, the screws 34 are rethreaded in the corresponding bores 52. While the rethreaded screw may be the same screw, it will be appreciated that where a number of screws are being rethreaded, the screws may be rethreaded in a different arrangement. Alternatively, new screws, of the same or a somewhat different configuration, may be used. For example, the new screws may have the same pitch but a slightly larger or smaller helix angle.

Although the anti-thread stripping function of the rib 80 is not fully understood, it is suggested that the rib (or remaining portion thereof may act to push the screw 34 slightly out of axial alignment with the X-axis, toward the diametrically opposite side of the cylindrical lower portion 68 of the interior wall surface, such that the thread 118 of the screw engages the helical groove 140 of the bore. In particular, as the screw is being presented to the bore and being rotated by a driver, the rib in the boss catches the screw tip 116 and allows it to find the original start of the helical groove 140 by providing a single point of contact. This allows the screw 34 to thread into the existing groove 140 instead of creating a new one. In this way, the likelihood of the screw creating a second thread in the boss 12, 14, 16, 18 is reduced. As a consequence, the likelihood of a boss having its thread stripped and being unable to grip the screw adequately is also reduced. It is also considered that the rib helps vertically position the screw by forcing one of the turns of the screw thread to rest on the rib top, or what may be left of it after first insertion, causing the screw upon rotation to go into the same thread start. The lead in turn of the thread, being slightly narrower than the rest of the thread, misses the rib, but the next subsequent turn of the thread behaves in this manner. The effect of the rib is thus very similar to that of the practice of rotating a screw counter clockwise until it "drops" into the existing threads. This procedure, although reliable when driving by hand, is time consuming and not generally conducive to use with electric or pneumatic drivers. The ribbed screw achieves a similar result, without the need for counter clockwise rotation.

Analysis of a wide variety of potential sources for failure of bosses has revealed that screw presentation to the bore 52 is a significant factor in failure of bosses. In a conventional boss, the presentation is different for each reinsertion. As a result, a second thread can be created, leading to eventual stripping of the threads. The stripping of threads is found to be particularly prevalent where power drivers, such as electrical or pneumatic drivers, are used. Where two (or more) threads exist in a boss, the load carrying capacity of the boss is reduced and the normal seating torque applied to the screw during threading tends to shear off the plastic, creating a stripped boss. In the case of bosses having a rib, the rib assists in ensuring that the thread 118 of the screw is aligned with the helical groove 140 created in the boss. Specifically, the screw thread enters the boss thread at its starting point.

Other factors, such as side wall width d have also been found to play a part in boss failure. The effect of wall width on boss failure can be minimized. For example, boss failures due to cracking of the side wall can be significantly reduced by ensuring that the sidewall has a width in a specified range.

In one embodiment, the rib 80 provides a mean probability of success for a boss over six threadings of 99%, or greater (i.e., the screw is inserted six times and still grips the boss adequately on the sixth threading). In one specific embodiment, there is mean probability of 99.5%, or greater, that the ribbed boss will not be rendered inoperable after 6 successive threading and unthreading operations. For eight bosses undergoing the six threadings, this amounts to a failure rate of any one of the bosses of about 5%, or less.

Although a variety of types of screw may be employed, an exemplary screw suited to use with highly filled hard plastics, such as PPO resins, is one with a helix angle of about 10° and a pitch p of about 1.5 mm.

The chassis may be formed by an injection molding process, with core pins of the injection molding apparatus forming the bores of the respective bosses. The core pins each have a groove, which defines the rib.

Figure 8:
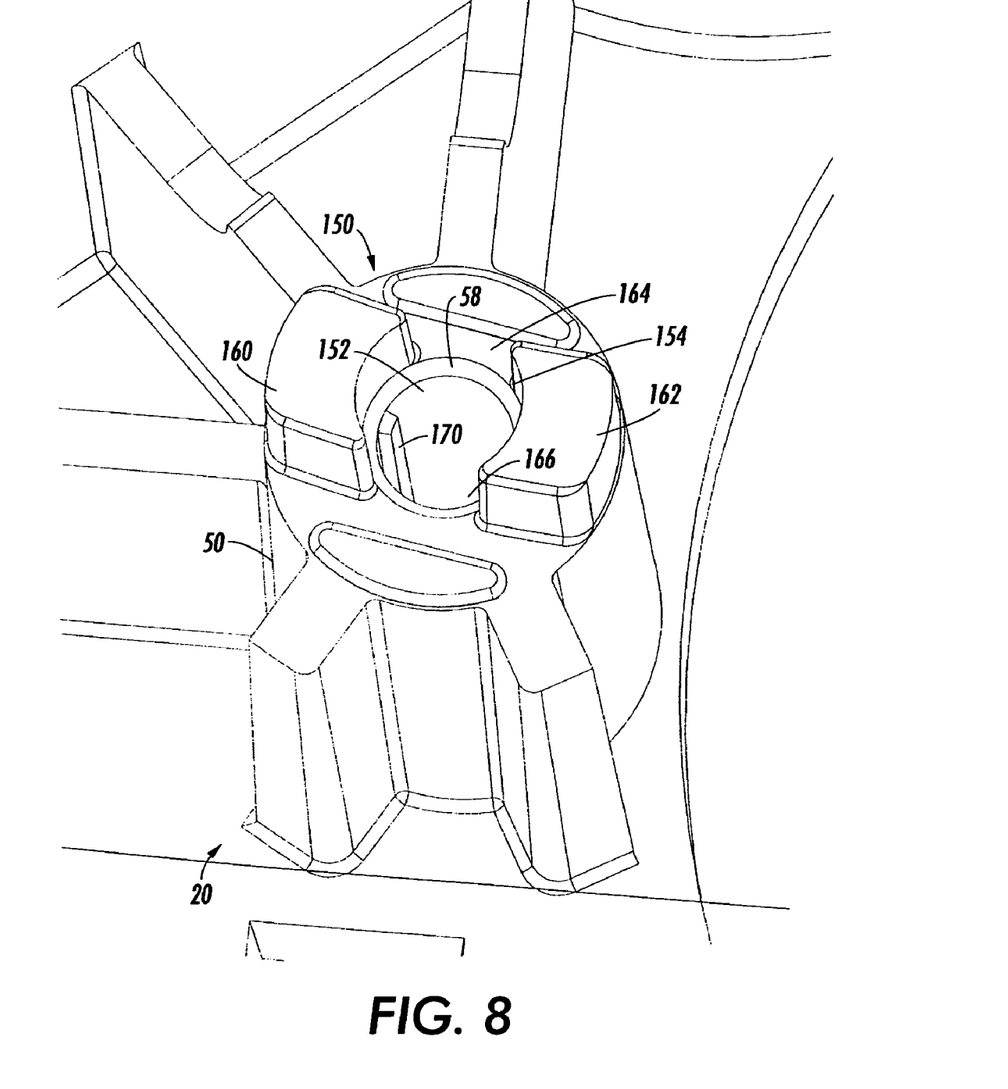
FIG. 8 is a top plan view of a boss according to a second embodiment.

With reference now to FIG. 8, another embodiment of a boss 150 is shown. The boss is similar in design and function to bosses 12, 14, 16, 18, except as noted. The boss 150 defines an axial bore 152, with an upper bore portion 154, and a lower bore portion 156. The upper bore portion 154 is defined in part by sidewall extensions 160, 162, which define arcuate portions of an imaginary cylinder having a similar shape to the sidewall 50 of the boss 16. Cut out portions 164, 166 are formed in diametrically opposite regions of the upper bore portion 154.

A rib 170 extends only in the lower bore portion 156. In the illustrated embodiment, the rib is positioned directly below one of the two sidewall extensions 160, 162, although it is also contemplated that the rib may extend up into the upper bore portion adjacent one of the sidewall extensions 160, 162. The rib 170 functions to locate the screw 34 in the helical groove 140 in a similar manner to that described for rib 80.

While the embodiments have been described with particular reference to printers, it will be appreciated that there are other applications for the anti-strip device described, including, but not limited to other imaging devices, such as fax machines, copiers, scanners, and the like, as well as other applications where components are to be mounted to a base structure, such as computers, laboratory equipment, and other electrical and electronic devices.

Without intending to limit the scope of the invention, the following Examples demonstrate the effectiveness of the rib in reducing boss failure.

EXAMPLES

Example 1

Figure 9:
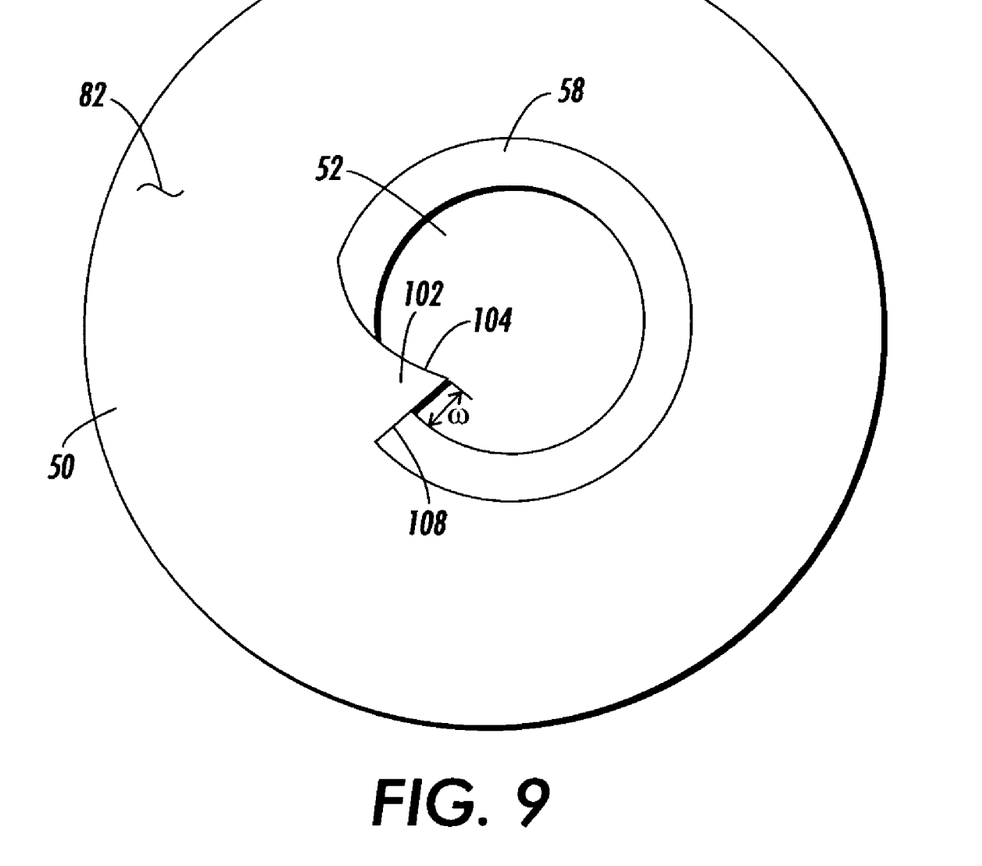
FIG. 9 is a perspective view of a support surface with a boss according to a third embodiment.

A chassis for a printer is formed of a glass-filled PPO resin (Noryl™ HM4025) and has integrally molded bosses of the type illustrated in FIGS. 4 and 8. Bosses on the chassis of different types are selected for testing. Ten bosses with ribs of each of three different geometries are used for evaluating the rib. These were, respectively, a) bosses with a helical projection, as illustrated in FIG. 9, b) bosses with a rib which extends only in the upper portion of the bore, and c) bosses with a rib which extends in both the upper and lower bore portions, as illustrated in FIGS. 2-7. Ten bosses on a printer chassis formed without a rib are used as a control. Shims of a nominally identical thickness are used to simulate clamping of a component.

Screws of the type illustrated in FIG. 6 are threaded into each of the selected bosses using a pneumatic (assembly line) screw-driver to form a thread in the bore of each boss. The screws are then unthreaded and rethreaded in a sequence to avoid overheating of the bosses and potential failure of the boss as a consequence. For the unthreading and rethreading operations, an electric driver is used, which is calibrated to about 1.36 Newton-meters maximum torque. With each rethreading, the screw is rotated about one quarter turn, so that the presentation of the screw to the bore is not the same as on the prior threading. The threading and unthreading is repeated until the boss fails. The number of threadings to failure is recorded. A failure is considered to occur when the thread of the bore is stripped and a screw is no longer able to grip on the boss.

The data is analyzed with a Weibull distribution method. This method is described, for example, in D. G. Raheja, "Product Assurance Technologies: Principles and Practices," pp. 30-33 (Publisher: Design For Competitiveness, Inc., Mt. Pelier, Executive Ctr., 9811 Mallard Dr., Suite 213, Laurel, Md. 20708; 1999). Weibull analysis can be applied to life test data from fatigue tests.

The values for number of threadings to failure are placed in order, from lowest to highest. An order number is assigned to each failure, sequentially. A median rank value is then assigned to each order number. The values are plotted according to median rank value and time to failure. In the present case, the number of threadings to failure is plotted on the x-axis using a log scale. The y-axis shows the % failure (on the left y-axis) or % survival (on the right y-axis), also on a log scale.

A line of best fit, for example, obtained by a least squares method, is drawn through the points. The reliability can then be determined from the expression:

$$R(n)=1-F(n)$$

where R(n) is the reliability as a function of the number n of threadings to failure and F is the failure rate.

Figure 10:
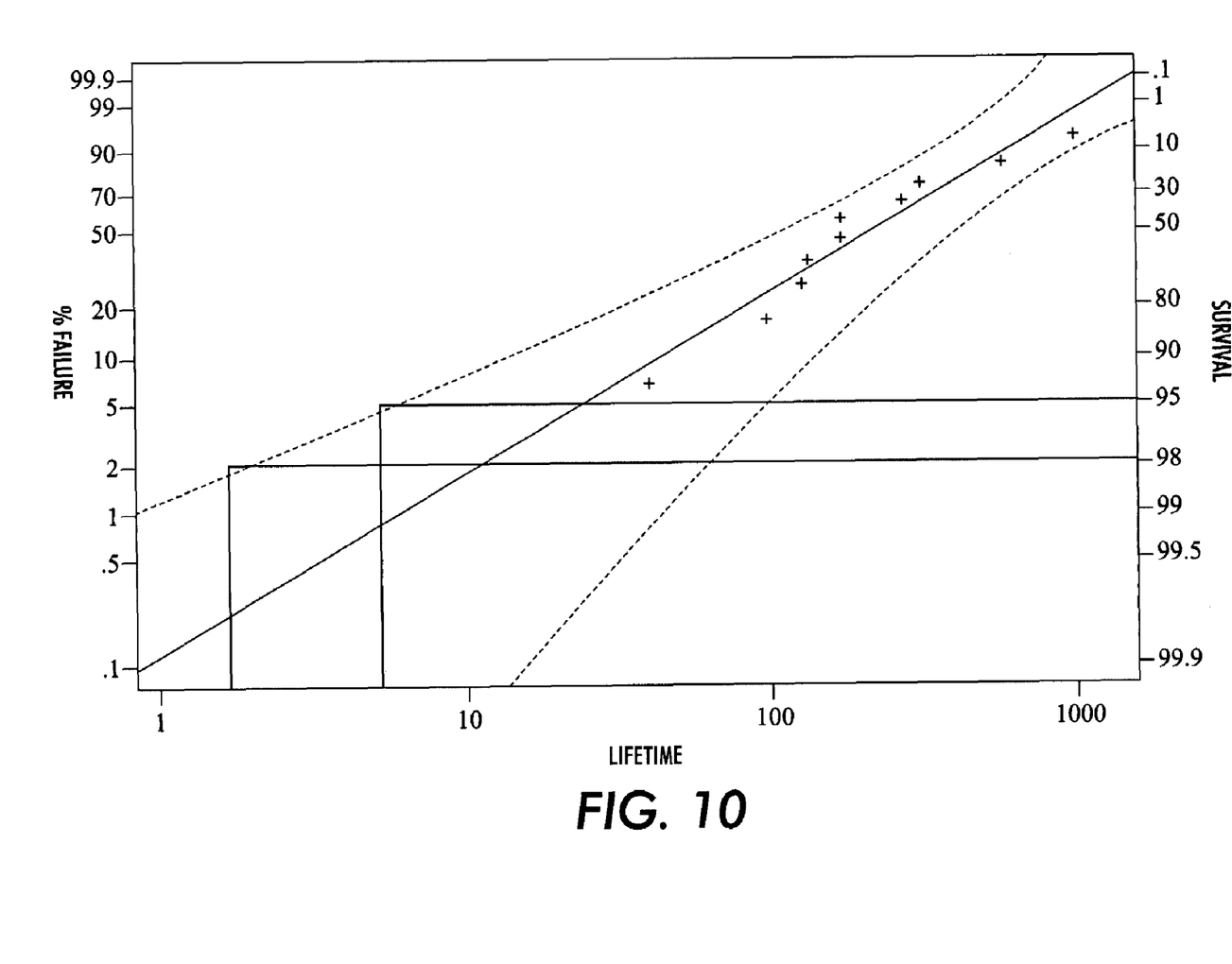
FIG. 10 is a plot showing the % failure vs. number of insertions to failure of bosses formed without ribs.

FIG. 10 shows a Weibull plot for the results for bosses formed without a rib. Each data point is represented by a +. It can be seen that at the 95% confidence level (indicated by the upper dashed curve), there is a 98% reliability for a single threading operation. For five insertions at the 95% confidence level, there is only about a 95% reliability.

Figure 11:
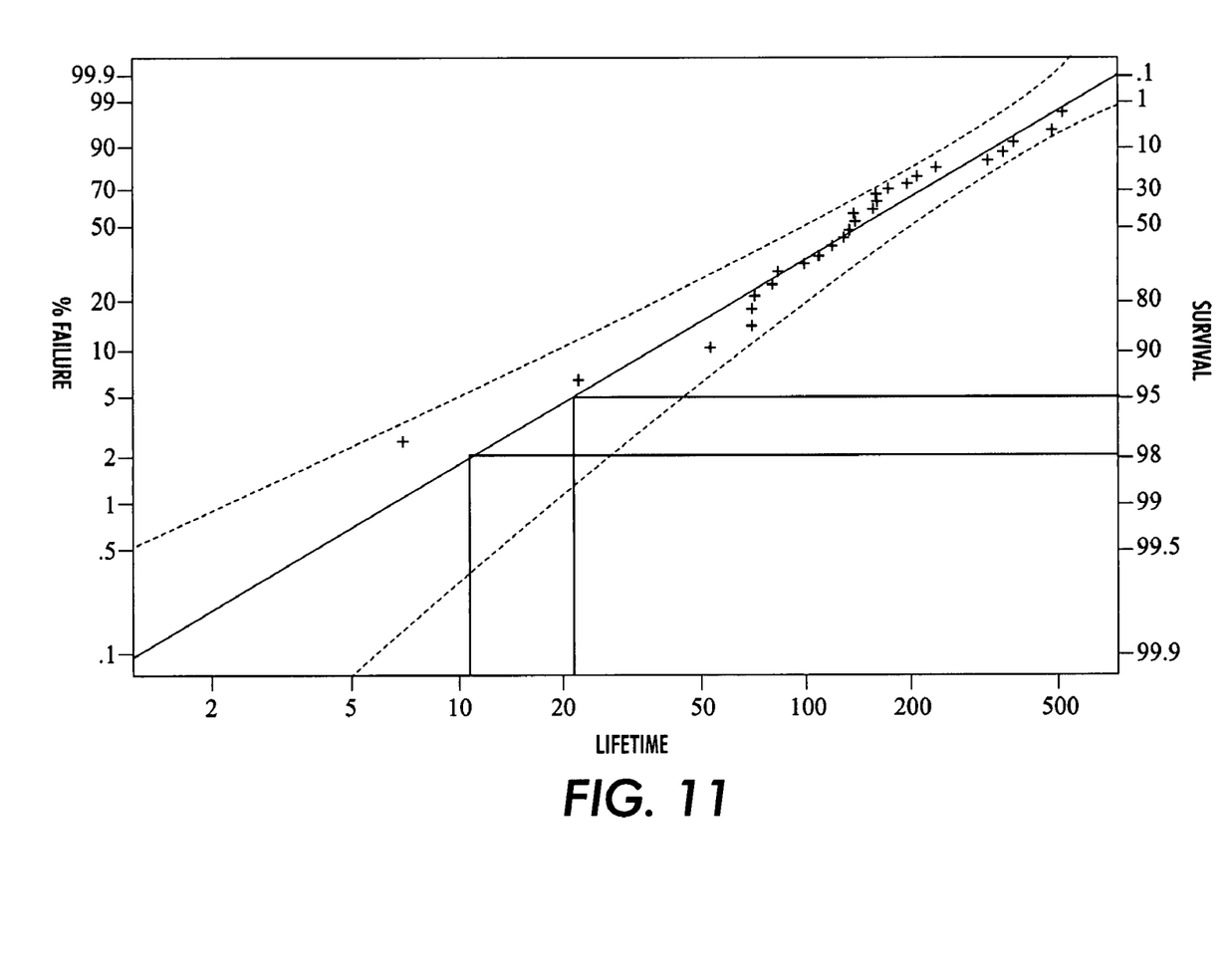
FIG. 11 is a plot showing % failure vs. the number of insertions to failure of bosses formed with ribs.

FIG. 11 shows comparable results for bosses with ribs (results for all three types of bosses are included). The reliability levels are higher than for the bosses without ribs. For example, after five insertions, the reliability is 98% at the 95% confidence level, as compared with 95% reliability for the bosses without ribs. Even at about 12 insertions, the reliability is at about 95%, comparable to that of the ribless boss after five insertions.

This difference in reliability translates to a significant overall improvement in chassis reliability, particularly when a large number of bosses are used. For example, a chassis may include 20 or 40 such bosses and a single boss failure can constitute a failure of the entire chassis. For example, for a chassis having 43 bosses, the chassis with the ribbed bosses had a total reliability of 84.2% for six insertions. For the same number of ribless bosses, the total reliability is only 64.9%.

It is not generally expected, of course, that all components on a chassis are to be replaced regularly. For example, if only some of the components, such as gear box, printer drive, and circuit boards, are replaced five times (twenty-seven bosses), the reliability for these components is about 89.7 for ribbed bosses and 76.2% for ribless bosses. Where only eight bosses are threaded five times, for example, the bosses for the circuit boards and printer drive, which is still relatively unlikely, the reliability at the 95% confidence level exceeds 95% for the ribless bosses.

Data for the three boss geometries was compared. It was found that bosses with a rib which extends in both the upper and lower bore portions performed better overall than bosses with a helical projection, and bosses with a rib which extends only in the upper portion of the bore.

Example 2

Figure 12:
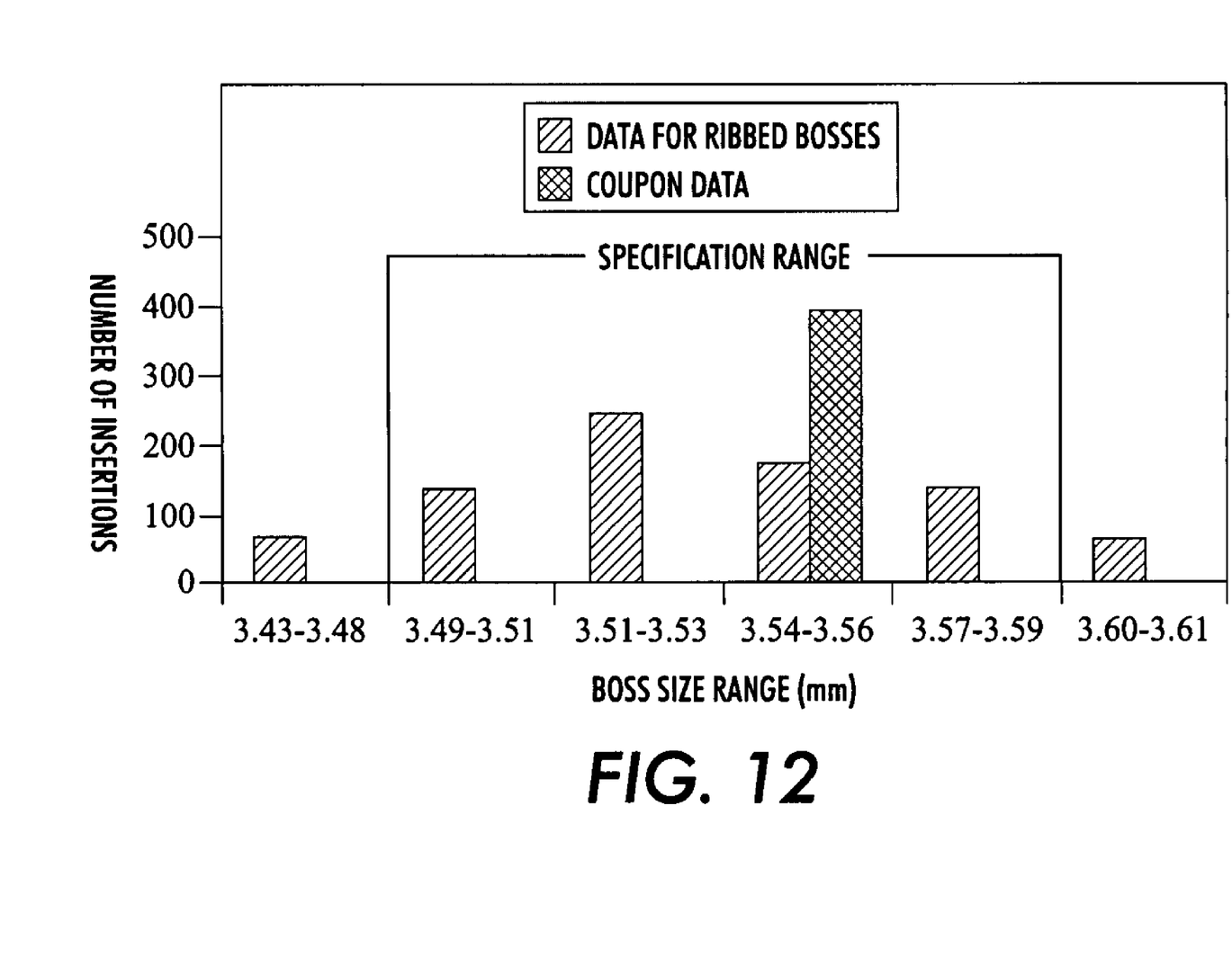
FIG. 12 is a bar graph of the average number of insertions to failure of bosses formed with ribs vs. outer diameter of the boss at the top of the boss.
Figure 13:
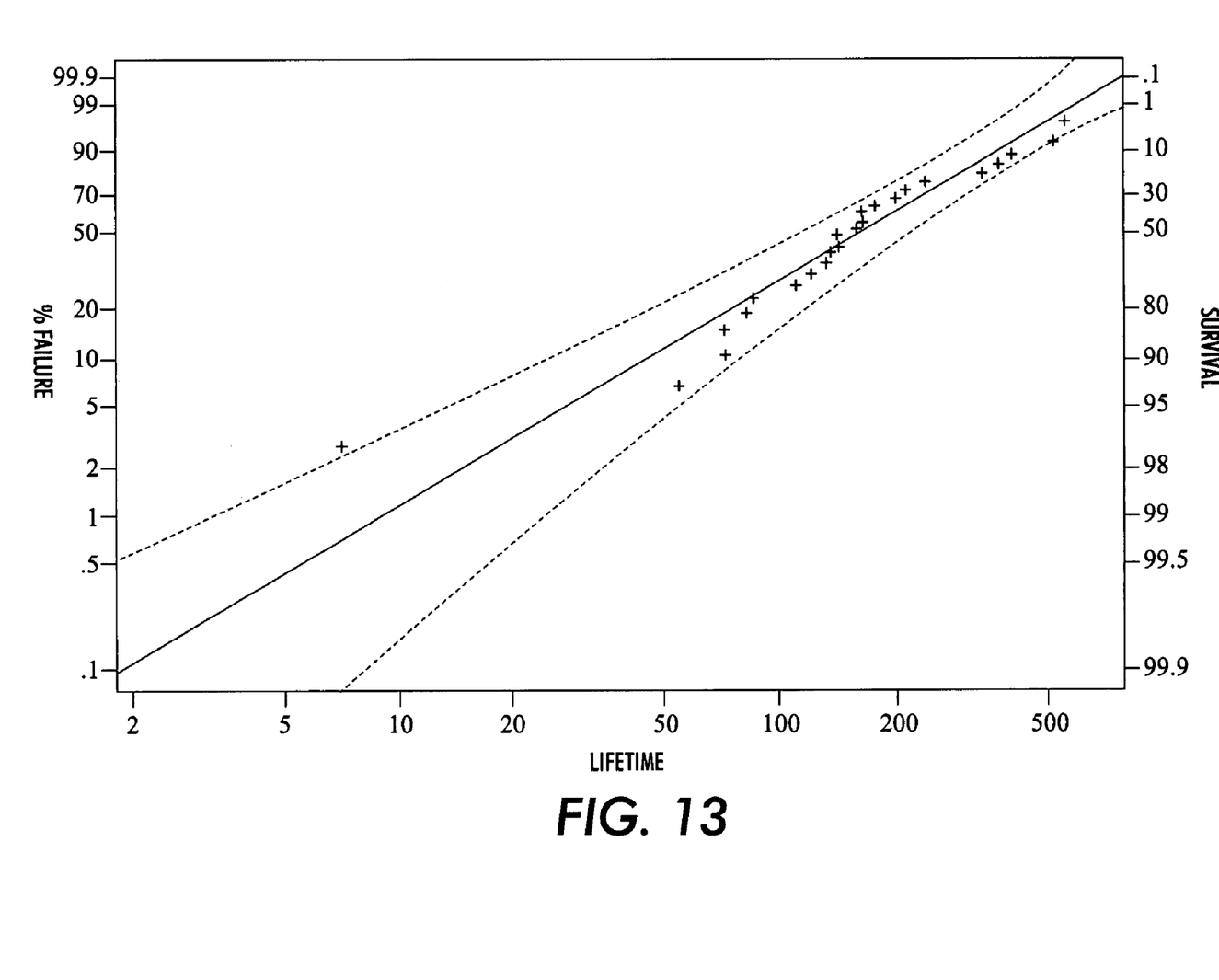
FIG. 13 is a plot showing % failure vs. the number of insertions to failure of bosses formed with ribs after adjustment for out of specification bosses.

Chassis are formed with 30 ribbed bosses as described for Example 1. The nominal diameter of each boss was 354 mm at the top. The actual diameter of each of the bosses is measured. It was found that this diameter has an influence on the number of insertions to failure, as illustrated in FIG. 12. The results for bosses with a nominal top diameter outside of a specified range (as illustrated) are ignored for a normalized Weibull plot. FIG. 13 shows the normalized plot for the ribbed bosses, by way of example.

Table 1 summarizes the data obtained in terms of mean reliability after six insertions, mean number of insertions to failure at the 95% confidence level, and reliability at the 95% and 99% confidence limits, respectively. Ribless bosses are compared with ribbed bosses, both before and after adjustment of the data to account for bosses that were not formed to specification, in terms of internal top diameter. Coupons with a single rib were also tested.

TABLE 1

|  | Ribless Bosses | Bosses with Rib | Bosses with Rib (adjusted) | Coupon with Rib |
|---|---|---|---|---|
| 6 insertion, mean reliability | 99% | 99% | 99.4% | 99.6% |
| No. of Insertions at 95% mean Reliability | 11 | 21 | 28 | 45 |
| Reliability at 99% (95% Confidence Limit) | 1-12 | 2-18 | 3-27 | 3-45 |
| Reliability at 95% (95% Confidence Limit) | 8-70 | 10-48 | 12-60 | 20-110 |

The "normalized" results thus obtained showed a 99.4% reliability after 6 insertions per boss and a 95% reliability at 28 insertions per boss for the ribbed boss. The results suggest that by specifying tolerance for the boss dimensions more closely, a further improvement in boss reliability can be achieved. The comparable results for the non-ribbed bosses were less than 99% reliability after 6 insertions per boss and a 95% reliability at 11 insertions per boss.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof. The recited order of processing elements or sequences, or the use of numbers, letters, or other designations therefore, is not intended to limit the claimed process to any order except as specified in the claim itself.

The invention claimed is:

1. A support member comprising:
   a support panel; and
   a retention element integrally formed with the support panel and of the same material as the support panel for use in mounting an associated component to the support panel, the retention element defining a bore for receiving an associated threaded fixing element which mounts the component to the support panel and a protrusion which extends into the bore from a sidewall thereof;
   the protrusion including a rib which extends generally parallel with a longitudinal axis of the bore, the rib including first and second side surfaces which connect an outer surface of the protrusion with a side wall of the bore.

2. The support member of claim 1, wherein the retention element includes a boss which extends from the support panel.

3. The support member of claim 2, wherein the boss is formed from plastic.

4. The support member of claim 1, wherein the bore includes a first portion located adjacent to a fixing element receiving opening of the bore and a second portion, spaced from the opening, the second portion having a smaller diameter than the first portion.

5. The support member of claim 4, wherein the protrusion extends in at least the second portion of the bore.

6. The support member of claim 1, wherein at least one of the outer surface and the first and second side surfaces has a taper toward an end of the bore which is opposite to a fixing element receiving opening of the bore.

7. The support member of claim 1, wherein the support member comprises a chassis of an imaging device.

8. An imaging device comprising the support member of claim 1.

9. The support member of claim 1, comprising a plurality of the retention elements, each of the retention elements being integrally formed with the support panel.

10. A supported member comprising:
    a support panel; and
    a retention element for use in mounting an associated component to the support panel, the retention element defining:
    a bore for receiving an associated threaded fixing element which mounts the component to the support panel, and
    a protrusion which extends into the bore from a sidewall thereof,
    the protrusion including an outer surface which defines an arc of an imaginary circle which is concentric with the bore and first and second side surfaces which connect the outer surface of the protrusion with a side wall of the bore, at least one of the outer surface and the first and second side surfaces has a taper toward an end of the bore which is opposite to a fixing element receiving opening of the bore.

11. The support member of claim 10, wherein the taper is of from about 0.2° to about 1.0°.

12. The support member of claim 10, wherein the protrusion subtends an angle from the longitudinal axis of the bore of less than 30°.

13. The support member of claim 10, wherein the support member comprises a chassis of an imaging device.

14. A support member of comprising:
- a support panel; and
- a retention element integrally formed with the support panel and of the same material as the support panel for use in mounting an associated component to the support panel, the retention element defining a bore for receiving an associated threaded fixing element which mounts the component to the support panel and a protrusion which extends into the bore from a sidewall thereof;
- the protrusion subtending an angle from a longitudinal axis of the bore of at least 10° and including a rib which extends generally parallel with a longitudinal axis of the bore.

15. A combination of a retention element and a fixing element comprising:
- a retention element which defines a bore and a projection which extends into the bore;
- the projection subtending an angle of less than about 30° of a circle defined by the bore and comprising a rib which extends generally parallel with a longitudinal axis of the bore; and
- a threaded fixing element which is received by the bore, and which forms a helical groove in the bore, the projection engaging a threaded portion of the fixing element as the threaded fixing element is threadably engaged with the groove.

16. The combination of claim 15, wherein the fixing member comprises a screw.

17. The combination of claim 15, wherein the projection has an outer surface which defines an arc of an imaginary circle centered on the longitudinal axis of the bore.

18. The combination of claim 17, wherein the imaginary circle has a diameter which is less than a maximum diameter of the screw.

19. The combination of claim 18, wherein the imaginary circle has a diameter of which is about that of the minimum diameter of the screw.

20. An imaging device comprising the combination of claim 15.

21. The imaging device of claim 20, further comprising:
- a chassis which includes a plurality of the retention elements;
- a plurality of the fixing members; and
- at least one component which is clamped to the chassis with the fixing elements and the retention elements.

22. A support member comprising:
- a support panel; and
- a retention element integrally formed with the support panel and of the same material as the support panel for use in mounting an associated component to the support panel, the retention element defining a bore for receiving an associated threaded fixing element which mounts the component to the support panel and a protrusion which extends into the bore from a sidewall thereof;
- the protrusion including a rib which extends generally parallel with a longitudinal axis of the bore, the projection subtending an angle of less than about 30° of a circle defined by the bore.

* * * * *